United States Patent [19]
Tsao et al.

[11] Patent Number: 6,143,594
[45] Date of Patent: Nov. 7, 2000

[54] ON-CHIP ESD PROTECTION IN DUAL VOLTAGE CMOS

[75] Inventors: Alwin J. Tsao, Garland; Vikas I. Gupta, Dallas; Gregory C. Baldwin, Plano; E. Ajith Amerasekera, Plano; David B. Spratt, Plano; Timothy A. Rost, Plano, all of Tex.

[73] Assignee: Texas Instruments Incorporated, Dallas, Tex.

[21] Appl. No.: 09/491,604

[22] Filed: Jan. 26, 2000

Related U.S. Application Data

[62] Division of application No. 09/281,189, Mar. 30, 1999.
[60] Provisional application No. 60/081,119, Apr. 8, 1998.

[51] Int. Cl.[7] .............................................. H01L 21/8238
[52] U.S. Cl. ........................ 438/199; 438/154; 438/275; 438/197; 438/232; 257/357; 257/500; 257/546; 257/342
[58] Field of Search ................................... 438/199, 279, 438/241, 275, 283, 154, 200, 197, 659, 232; 257/355, 356, 357, 360, 392, 395, 500, 546

[56] References Cited

U.S. PATENT DOCUMENTS

| | | | |
|---|---|---|---|
| 5,276,371 | 1/1994 | Jinbo | 307/572 |
| 5,374,565 | 12/1994 | Hsue et al. | 437/30 |
| 5,438,213 | 8/1995 | Tailliet | 257/360 |
| 5,455,436 | 10/1995 | Cheng | 257/356 |
| 5,508,548 | 4/1996 | Tailliet | 257/360 |
| 5,515,226 | 5/1996 | Tailliet | 361/56 |
| 5,548,134 | 8/1996 | Tailliet | 257/173 |
| 5,576,570 | 11/1996 | Ohsawa et al. | 257/369 |
| 5,674,761 | 10/1997 | Chang et al. | 437/29 |
| 5,707,886 | 1/1998 | Consiglio et al. | 437/52 |
| 5,897,348 | 4/1999 | Wu | 438/200 |
| 5,953,606 | 9/1999 | Huang et al. | 438/241 |
| 5,994,176 | 11/1999 | Wu et al. | 438/200 |
| 5,998,245 | 12/1999 | Yu | 438/140 |
| 6,004,838 | 12/1999 | Ma et al. | 438/200 |
| 6,022,769 | 2/2000 | Wu | 438/200 |

OTHER PUBLICATIONS

Duvvury, et al. "ESD: A Pervasive Reliability Concern for IC Technologies", Proceedings of the IEEE, vol. 81, No. 5, May 1993, pp. 690–702.

*Primary Examiner*—Matthew Smith
*Assistant Examiner*—Belur V. Keshavan
*Attorney, Agent, or Firm*—Jacqueline J. Garner; W. James Brady, III; Frederick J. Telecky, Jr.

[57] ABSTRACT

In a split gate process for dual voltage chips, the N-type high-voltage transistors which are part of the ESD protection circuit, and therefore have the thicker gate oxide of the high-voltage transistors, can receive channel doping and drain extender doping which is the same as the core transistors. This causes these transistors to develop a high substrate current during an ESD event, triggering the protection circuit.

5 Claims, 10 Drawing Sheets

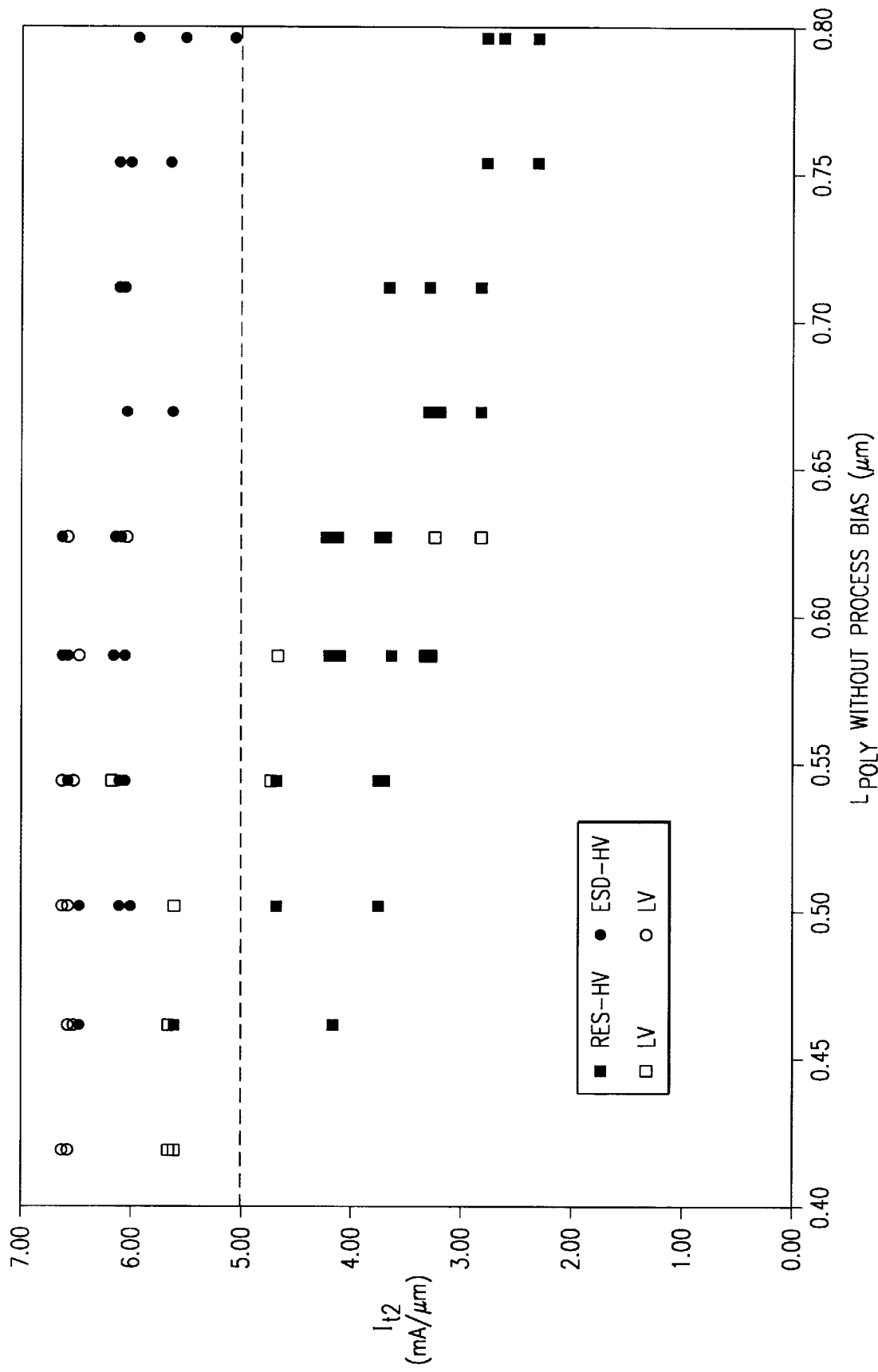

ON-CHIP ESD PROTECTION IN DUAL VOLTAGE CMOS

This application is a division of Ser. No. 09/281,189 filed Mar. 30, 1999 which claims benefit of Provisional No. 60/081,119 filed Apr. 8, 1998.

BACKGROUND AND SUMMARY OF THE INVENTION

The present invention relates to integrated circuit structures and fabrication methods, and especially to providing protection against electrostatic discharge in mixed voltage IC chips.

Electrostatic Discharge

Electrostatic discharge (ESD) is well known to cause damage to integrated circuits, and it is common to include protection circuits between the external pins and susceptible circuitry. Examples of protection circuits can be found in Duvvury et al., "ESD: A Pervasive Reliability Concern for IC Technologies", Proceedings of the IEEE, Vol. 81, No. 5, May, 1993, which is hereby incorporated by reference. Several ESD protection circuits noted in this article include NMOS transistors, such as in field plated diodes (FPD), low voltage trigger silicon controlled rectifiers (SCR), and gate-coupled NMOS (GCNMOS) devices. These devices rely on the ability of the parasitic lateral NPN bipolar device formed by the NMOS device to carry high currents under an ESD event. In FIG. 3, the cross-section of an NMOS transistor is shown with the parasitic lateral NPN. The lateral NPN is turned on by providing a voltage drop of about 0.7 volts across the substrate resistance, provided by either the avalanche current of the reverse biased drain/substrate junction or by the substrate current produced due to NMOS operation.

Dual Voltage Chip Architectures

As integrated circuit geometries have shrunk below one micron, supply voltages have also decreased. However, to interface with the new technologies, the possibility of using two supply voltages has appeared increasingly attractive. In this process option, the core transistors are typically used in the regions of the circuit where circuit density and performance are a primary concern. These core transistors can be fully optimized for performance and density, without concerns with the voltage requirements of interfacing to external circuit boards which may operate at higher voltages. The current operating voltages for input/output are typically equal to or greater than the operating voltage of the core, with typical combinations shown:

| Core Operating Voltage | Peripheral Operating Voltage |
| --- | --- |
| 3.3 V | 5.0 V |
| 2.5 V | 3.3 or 5.0 V |
| 1.8 V | 2.5, 3.3, or 5.0 V |
| 1.5 V | 1.8, 2.5, 3.3, or 5.0 V |
| <1.5 V | 1.5, 1.8, 2.5, 3.3, or 5.0 V |

At the peripheral input/output circuits, it is critical that they can sustain electrostatic discharge events.

Thus, process optimization for a dual-voltage chip presents some important problems. First, the basic process design should be determined, as far as possible, by optimization of the core devices, since this is the large majority of the area of the chip. The question is then how to modify the basic optimized process, to the smallest extent possible, to achieve adequate reliability and performance in the input/output peripheral devices. Of course, this must be done while avoiding such problems as channel hot carrier effects and punchthrough. Additionally, cost is a very important consideration, as the chips must be produced at a competitive price to be successful. This implies reducing the number of pattern levels, implants and diffusions steps required.

Split Gate Processes

One of the current methods of meeting this goal is through a split gate CMOS process. In this process, the high voltage transistors will have a thicker gate oxide, while typically having lower channel dopings and lower, less abrupt source/drain dopings. One of the problems with this solution is that there is a significantly reduced margin in the high-voltage ESD protection. This problem has several causes:

1) The thinner epitaxial silicon required by the core CMOS transistors causes a lower effective substrate resistance (Rsub) in the high voltage ESD transistors. A minimum value of Rsub is necessary to achieve the approximately 0.7 volt voltage drop required to turn on the parasitic lateral NPN bipolar which acts as the primary ESD protection device.

2) Process/cost restrictions require the same well profiles for both the core and the high-voltage transistors. This restricts the ability to tailor the p-well of the high-voltage transistors.

3) Process/cost restrictions require having the same source/drain implant conditions for both the core and the high-voltage transistors.

A number of solutions to this problem, such as separate source/drain patterns and implants, separate ESD patterns and implants, use of a silicide block pattern/process, or increasing epi thickness would result in significant cost additions. Other methods can be applied but would result in decreased performance, such as reduced SALICIDE thickness. Another option is to reduce the channel length only, but here the transistor would be constrained by off-state leakage requirements.

Improved ESD Protection at No Added Processing Costs

The present application discloses that the conventional ESD protection circuits can have their ESD margins improved by designing a high-voltage NMOS transistor in the ESD protection circuit that will generate more substrate current in an ESD event. This type of transistor can be accomplished by giving the N-type high-voltage transistors which are part of the ESD protection circuit a threshold voltage adjust implant (used to create the channel doping at the surface of the channel) and drain extender implant (LDD or MDD) which are the same as the core transistors. This doping is shallower than that used in the non-ESD high-voltage transistors, and gives a sharper junction profile. The sharper junction profile results in a higher electric field in the depletion region, and therefore provides more substrate current, essential in triggering the lateral NPN bipolar protection device in the ESD protection circuit.

Advantages of the disclosed methods and structures include improved protection against electrostatic discharges without additional costs.

BRIEF DESCRIPTION OF THE DRAWINGS

The disclosed inventions will be described with reference to the accompanying drawings, which show important sample embodiments of the invention and which are incorporated in the specification hereof by reference, wherein:

FIG. 4 is a graph of the secondary breakdown current (It2) vs the width of the gate line (Lpoly) without process bias, while

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Overview

Figure 1A:
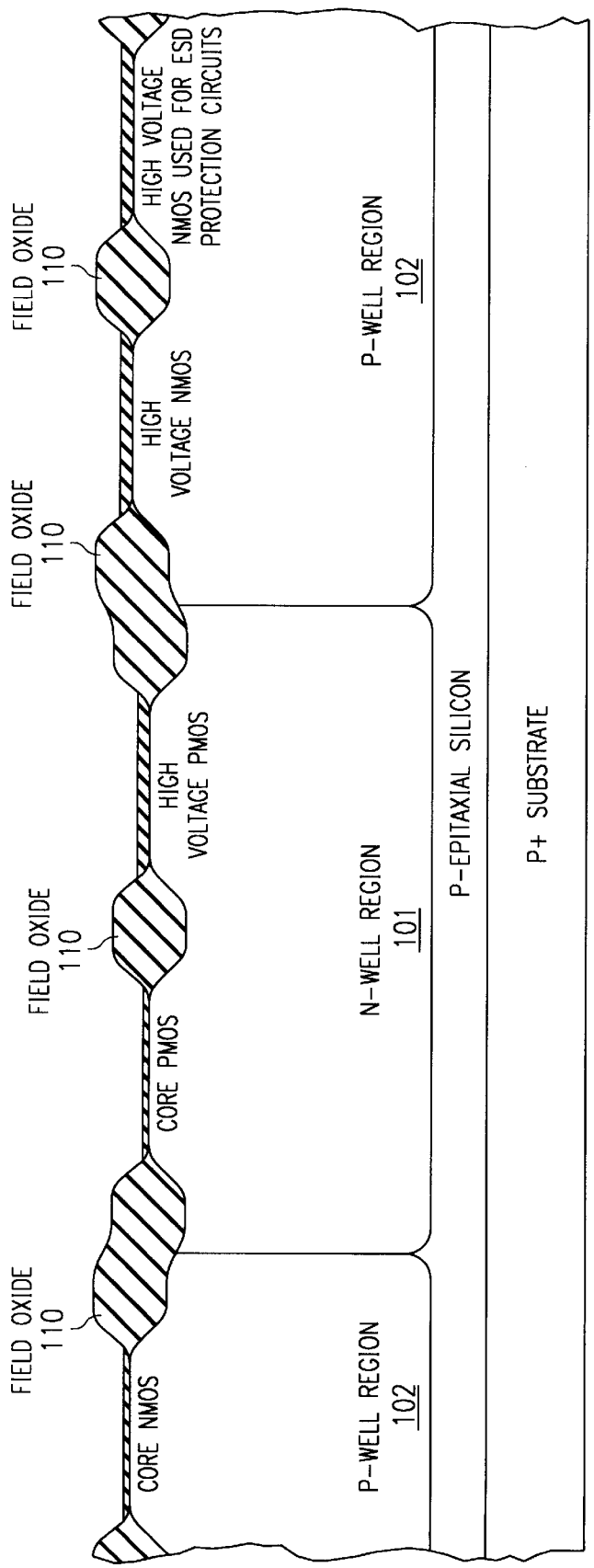
FIGS. 1A–F show a partially fabricated circuit at various stages during fabrication with the disclosed process.
Figure 1B:
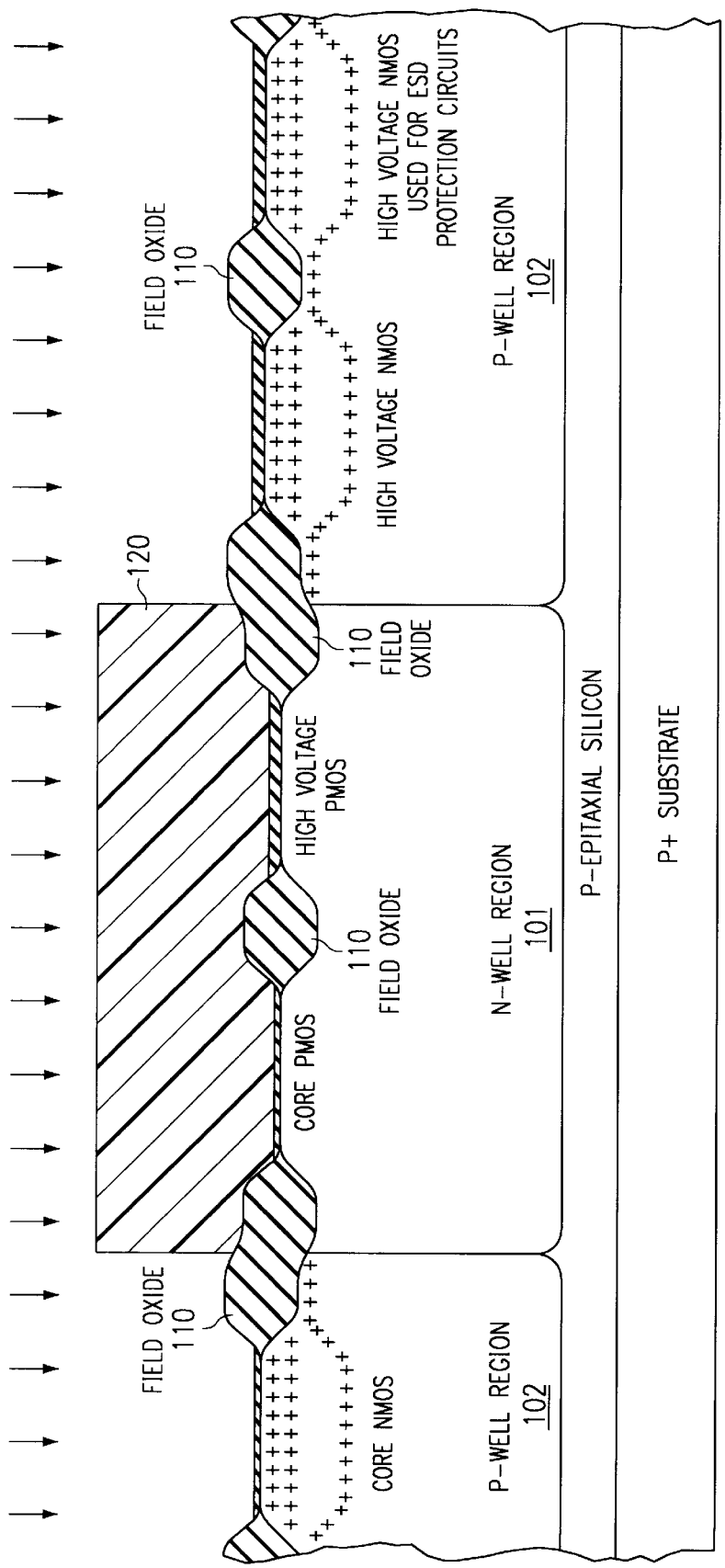
Figure 1C:
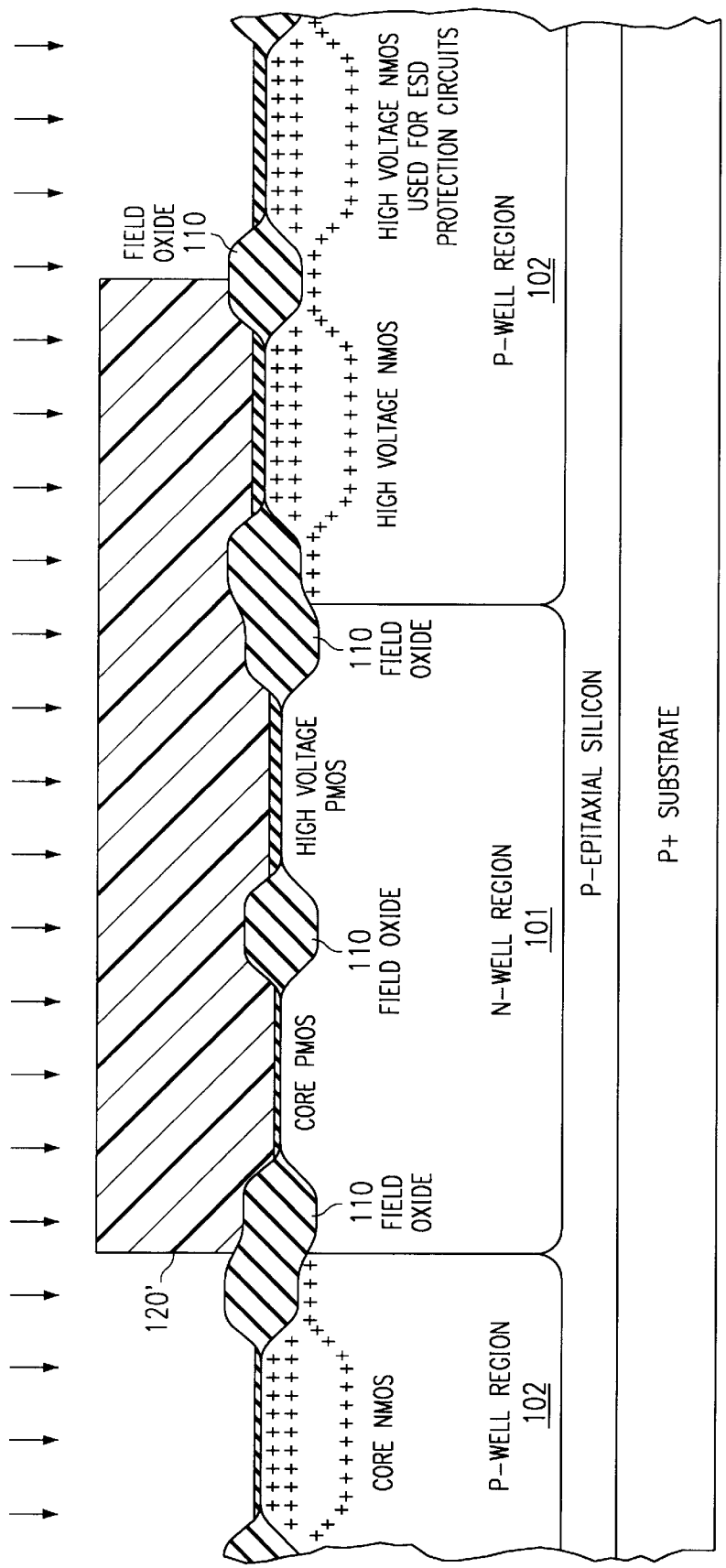
Figure 1D:
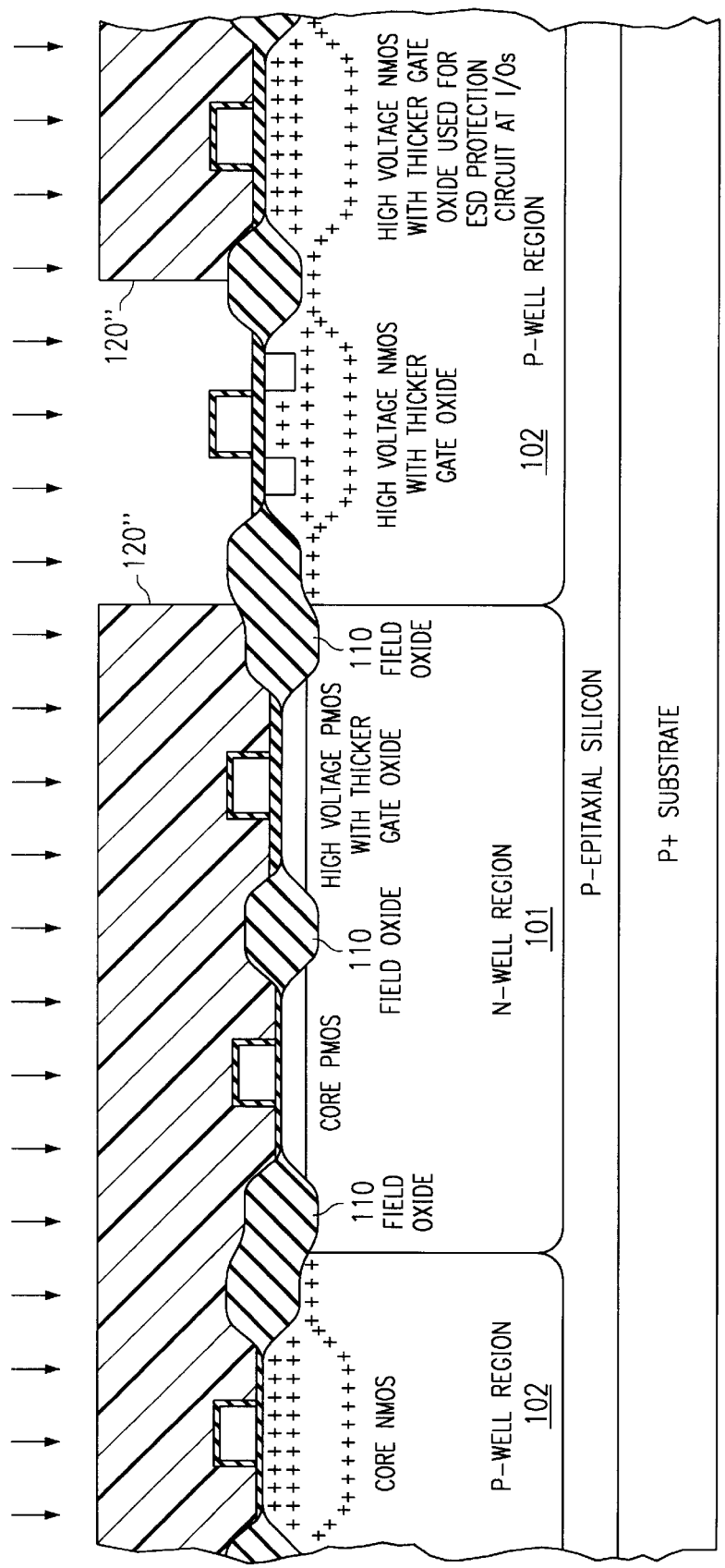
Figure 1E:
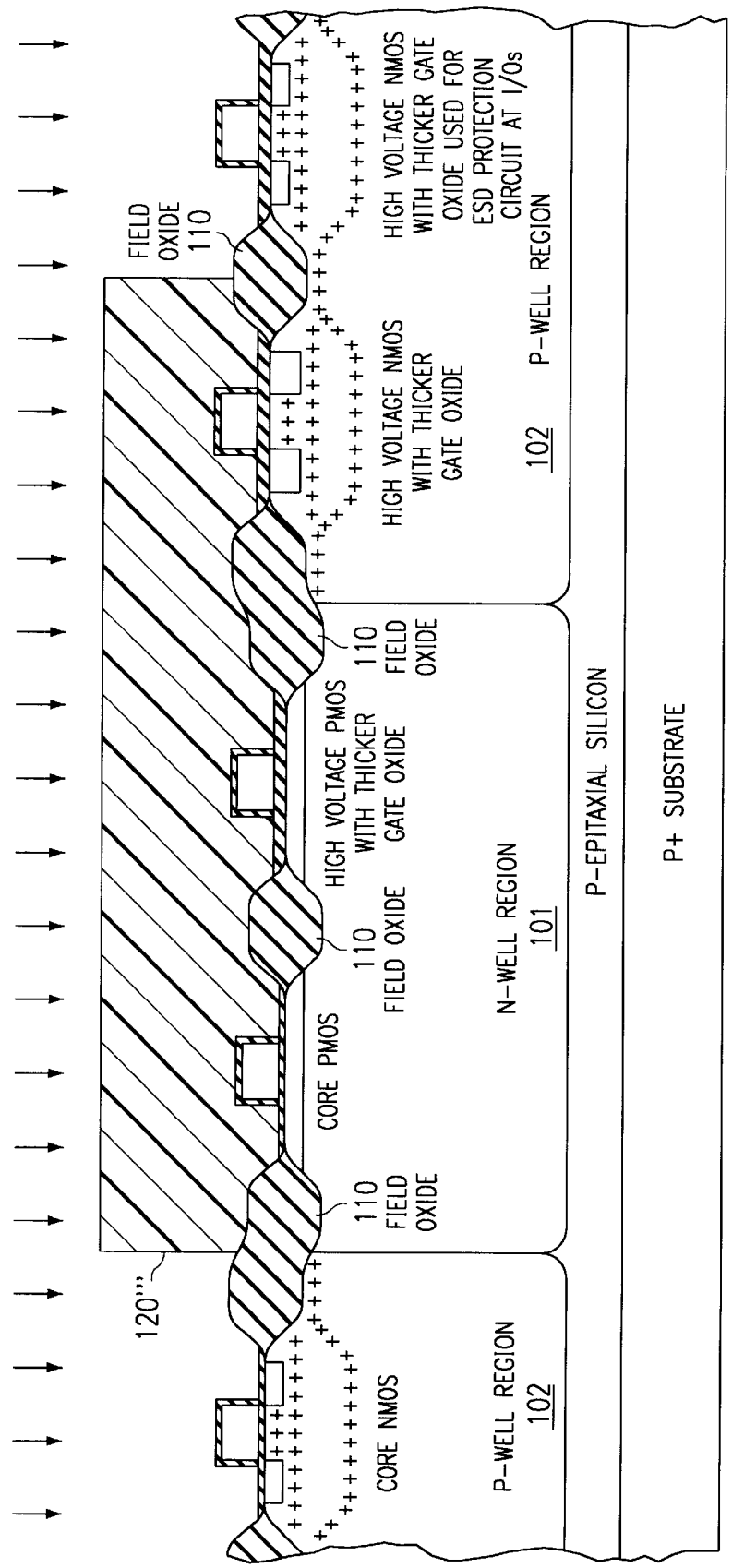
Figure 1F:
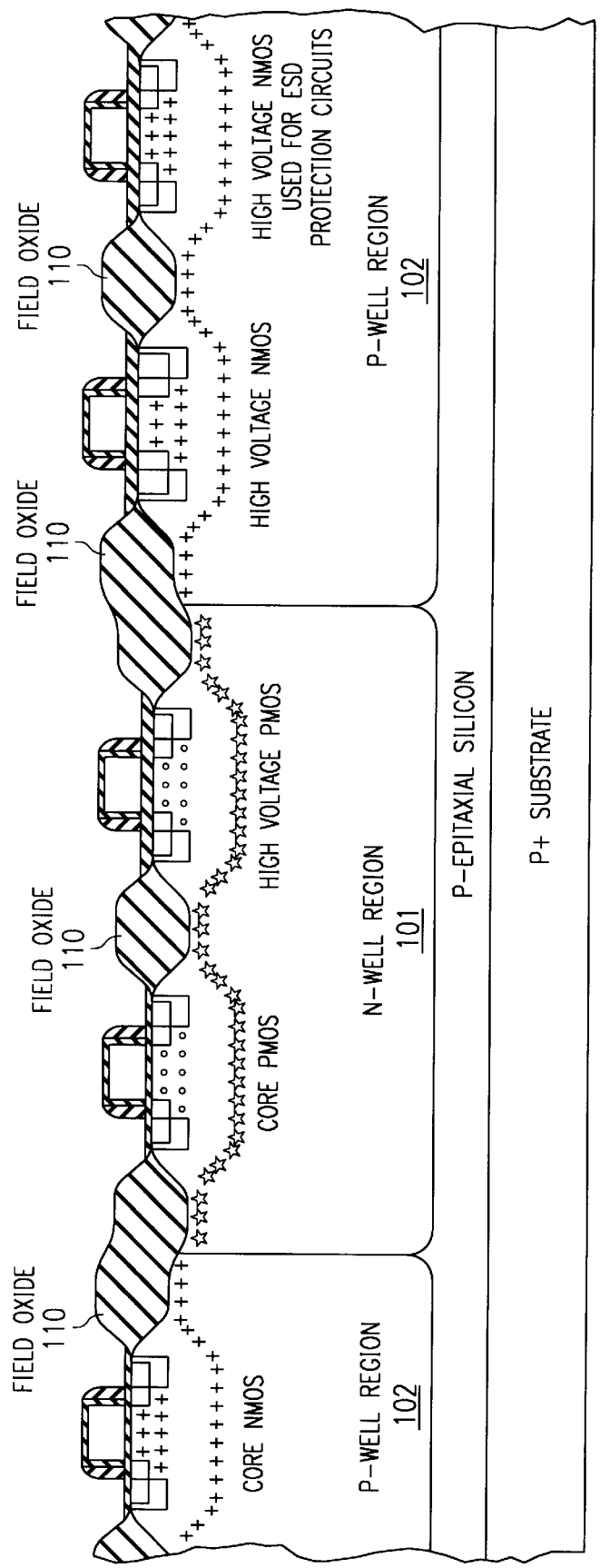
Figure 2:
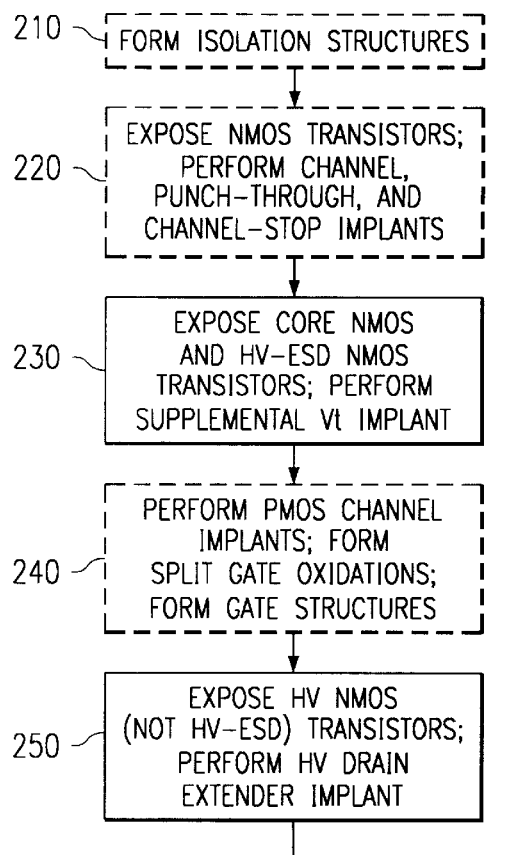
FIG. 2 is a flowchart of the relevant steps in the disclosed fabrication process.
Figure 2:
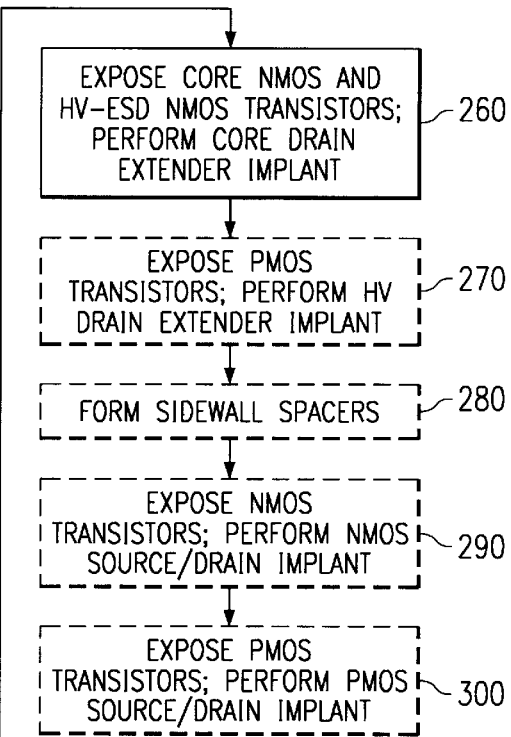
Figure 3:
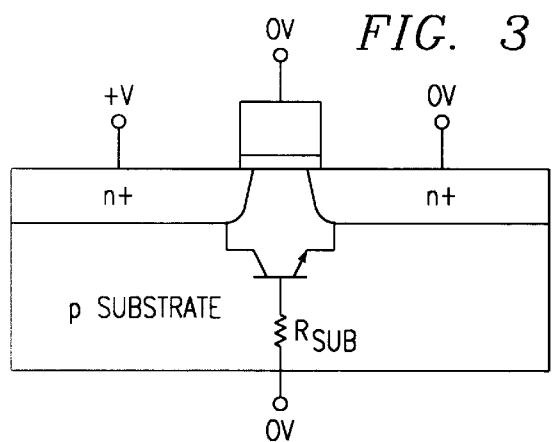
FIG. 3 shows a typical MOS transistor, and the parasitic bipolar transistor associated with it.

FIG. 2 is a flowchart of the disclosed process, which will now be discussed with reference to FIGS. 1A–F, which show cross-sections of the integrated circuit at various stages in the fabrication process. Note that steps in the flow which are affected by the disclosed process are shown in solid boxes, while steps which are not changed, such as formation of PMOS transistors, are shown in boxes with dotted lines. Of course, the changes which are seen in the process are to the reticle which is used in each step to determine which areas are implanted in any step.

The process begins with the formation of N-wells and P-wells and of isolation structures (step 210), such as the field oxide of FIG. 1A. In FIG. 1B, photo-resist is deposited and patterned to expose all of the NMOS transistors. Blanket implants are done of all the NMOS transistors to establish the Vt of the high-voltage transistors, prevent punchthrough, and form channel stops (step 220). The photoresist is then ashed.

In FIG. 1C, a new layer of photo-resist is then deposited and patterned to expose the core NMOS transistors and the high-voltage ESD transistors. A supplemental Vt implant is done (step 230) to set the Vt of these transistors, followed by ashing of the resist.

At this point, the NMOS transistors will be covered by photo-resist while the PMOS transistors receive their channel implants (not shown). It is understood by those skilled in the art that this step can also be performed prior to implantation of the NMOS transistors. This is followed by formation of the split gate oxides and the formation of gate structures (step 240). These processes are conventional, and are thus not illustrated in the figures.

As seen in FIG. 1D, a layer of photo-resist is then deposited and patterned to expose only the high-voltage transistors which are NOT a part of the ESD circuit; this is followed by a drain extender implant for these transistors (step 250).

In the next step, as shown in FIG. 1E, photo-resist is used to expose only the core NMOS and the high-voltage ESD NMOS transistors while LDD or MDD implants are formed in these transistors (step 260). The drain extender implant dosage and implant conditions will be tailored for optimum core transistors performance and channel-hot-carrier lifetime reliability at the operating voltage of the core transistors. In the NMOS HV-ESD transistors, this core drain extender, combined with the core channel doping and the smaller gate length allowed as a function of the higher channel doping, will result in significantly higher substrate currents in the case of an electrostatic event.

Next, the PMOS transistors will be exposed and receive their own drain extender implants (step 270) (not shown). Sidewall spacers are then formed on all transistors (step 280), and source drain implants are made, first to all the NMOS transistors (step 290), and then to the PMOS transistors (step 300), giving the structures shown in FIG. 1F.

After this, normal processing is resumed to complete the chip fabrication, such as formation of silicide contacts, deposition of dielectric, and formation of metallization structures.

Thus, three types of NMOS transistors, having the characteristics shown below, are formed in the disclosed process:

| Transistor Type | Channel Doping | Drain Extender Doping | Oxide Thickness | Substrate Current |
|---|---|---|---|---|
| Core | Core | Core | Core | Nominal |
| HV | HV | HV | HV | Nominal |
| HV ESD | Core | Core | HV | High |

Figure 7:
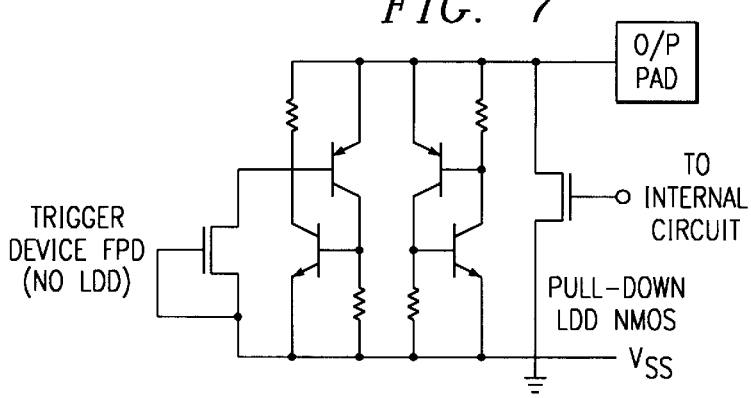
FIG. 7 is an example of a specific protection circuit in which the disclosed process may be used.

The HV-ESD transistors formed by the disclosed method can be used in circuits such as is shown in FIG. 7. This figure is from U.S. Pat. No. 5,455,436, which is hereby incorporated by reference.

First Embodiment

This embodiment was designed to be used in a chip receiving an external voltage of 5 volts and using a core voltage of 3.3 volts. Specific doping levels and oxide thickness are given as an example only, and are not to be taken as limits to the scope of the invention.

| | HV transistors (non-ESD) | LV transistors |
|---|---|---|
| Tox (gate) | 12–14 nm (nominal = 13) | 7.5–8.5 nm (nominal = 8) |
| L (gate) | 0.60–0.70 micron | 0.35–0.45 micron |
| NMOS: | | |
| Channel | 1.8E12 B11 @ 20 KeV | 2.8E12 B11 @ 20 KeV |
| L/MDD | 7.0E13 P31 @ 60 KeV | 4.0E13 P31 @ 40 KeV |
| | | 1.0E14 As75 @ 80 KeV |
| S/D | 4.0E14 P31 @ 50 KeV | 4.0E14 P31 @ 50 KeV |
| | 3.0E15 As75 @ 120 KeV | 3.0E15 As75 @ 120 KeV |
| PMOS: | | |

-continued

|  | HV transistors (non-ESD) | LV transistors |
|---|---|---|
| Channel | 5.0E12 P31 @ 50 KeV | 5.0E12 P31 @ 50 KeV |
| L/MDD | 3.5E13 B11 @ 20 KeV | 3.5E13 B11 @ 20 KeV |
| S/D | 2.0E15 B11 @ 20 KeV | 2.0E15 B11 @ 20 KeV |

(Punchthrough, channel stop implants, and well implant profiles are the same for the LV and HV transistors).

Second Embodiment

This embodiment was designed for a chip receiving an external voltage of 3.3 volts and using a core voltage of 2.5 volts. Again, specific doping levels and oxide thickness are given as an example only, and are not to be taken as limits to the scope of the invention.

|  | HV transistors (non-ESD) | LV transistors |
|---|---|---|
| Tox (gate) | 7.5–8.5 nm (nominal = 8) | 5–6 nm (nominal = 5.5) |
| L (gate) | 0.35–0.45 micron | 0.25–0.30 micron |
| NMOS: |  |  |
| Channel | 0.8E12 B11 @ 20 KeV | 3.5E12 B11 @ 20 KeV |
| L/MDD | 4.0E13 P31 @ 45 KeV | 3.4E13 P31 @ 15 KeV |
|  |  | 2.0E13 As75 @ 80 KeV |
| S/D | 1.5E15 As75 @ 70 KeV | 1.5E15 As75 @ 70 KeV |
|  | 1.5E15 P31 @ 60 KeV | 1.5E15 P31 @ 60 KeV |
| PMOS: |  |  |
| Channel | 6.8E12 P31 @ 50 KeV | 6.8E12 P31 @ 50 KeV |
| L/MDD | 1.7E14 B11 @ 20 KeV | 1.7E14 B11 @ 20 KeV |
| S/D | 1.5E15 B11 @ 10 KeV | 1.5E15 B11 @ 10 KeV |

(Punchthrough, channel stop implants, and well implant profiles are the same for the LV and HV transistors).

Results

The It2 or second break-down current is the current at which the parasitic lateral NPN breaks down catastrophically (a drain-substrate junction short) and hence is a measure of the current carrying capability of the transistor under ESD conditions, with higher values being better. The value is dependent on gate length (Lpoly) due to the Lpoly influence on the gain of the parasitic bipolar (Lpoly essentially defines the basewidth of the parasitic bipolar). A shorter Lpoly is better, but this value cannot become too small because of off-state leakage problems.

Figure 4A:
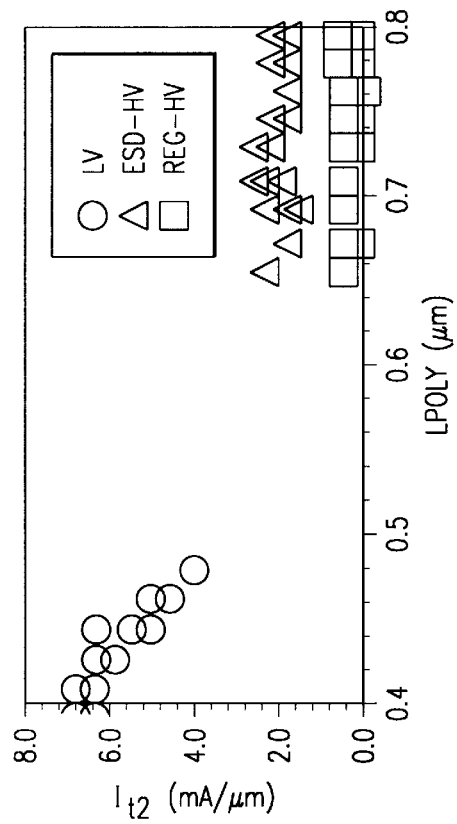
FIGS. 4A–C are graphs of It2 vs Lpoly for three different technologies.
Figure 4B:
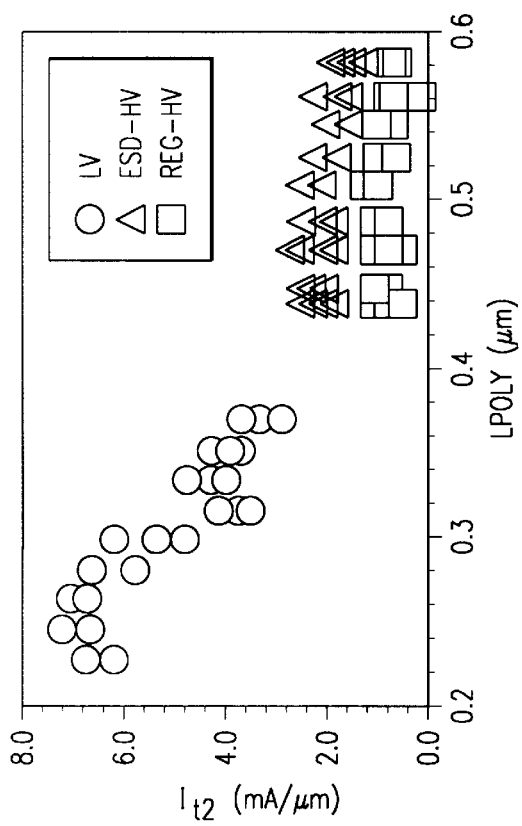
Figure 4C:
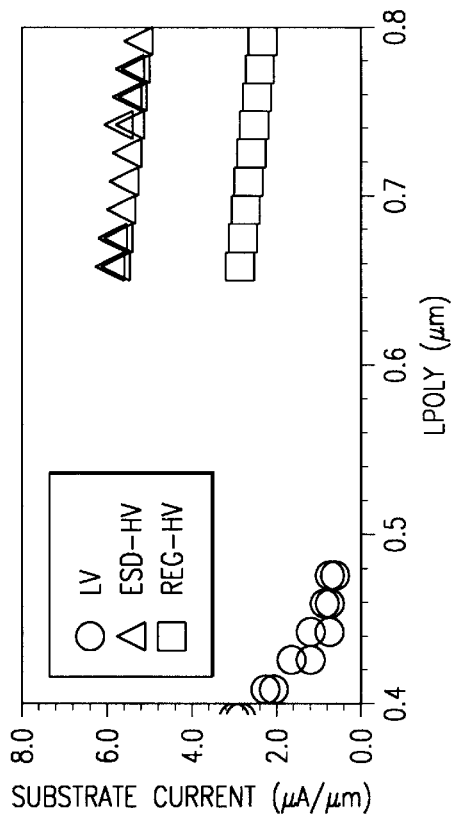

FIG. 4 shows It2 plotted vs Gate Length (Lpoly) without process bias, while FIGS. 4A–C are graphs of It2 vs Lpoly for three different split-gate technologies. For all the three technologies, the It2 performance of the ESD HV transistor is higher than that of the regular HV transistor.

Figure 5:
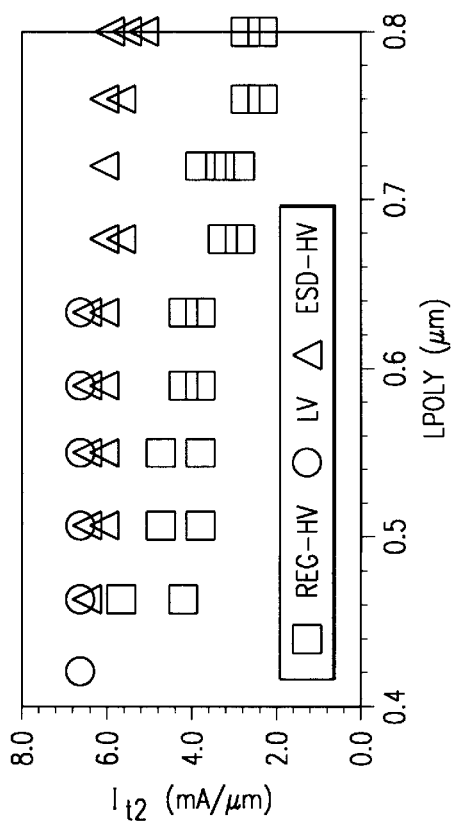
FIG. 5 is a graph of the peak substrate current vs Lpoly corresponding to the technology of FIG. 4C above.
Figure 6C:
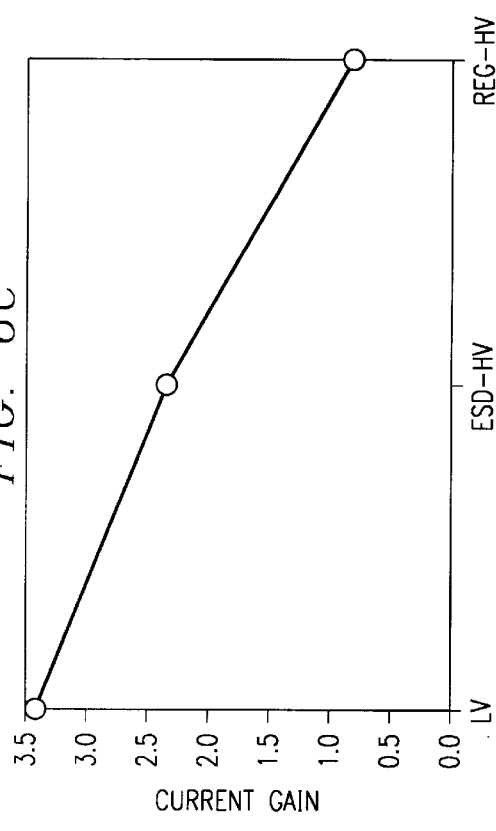
FIGS. 6A–D are charts comparing the values respectively of It2, Multiplication Factor (M), Current Gain, and Effective Substrate resistance (Rsub) for the three types of transistors, corresponding to the technology of FIG. 4A.
Figure 6D:
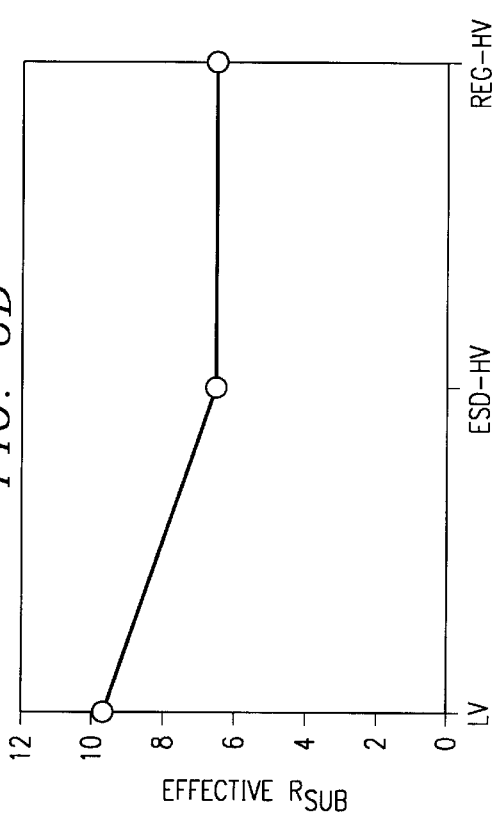
Figure 6A:
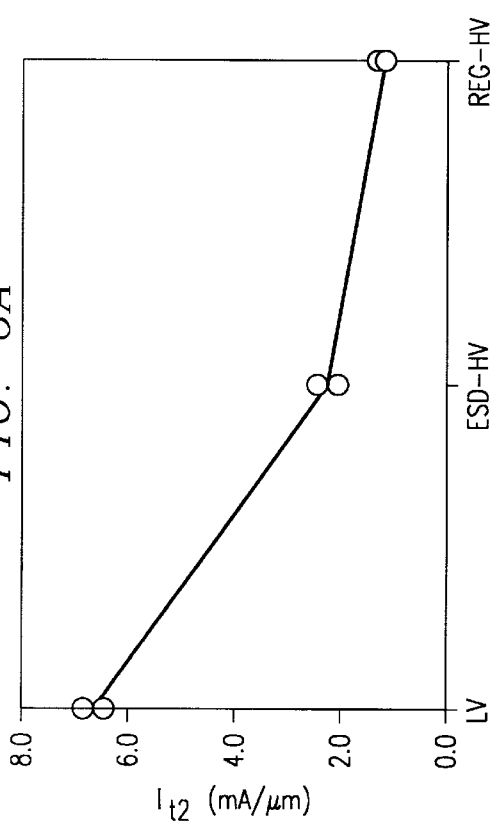
Figure 6B:
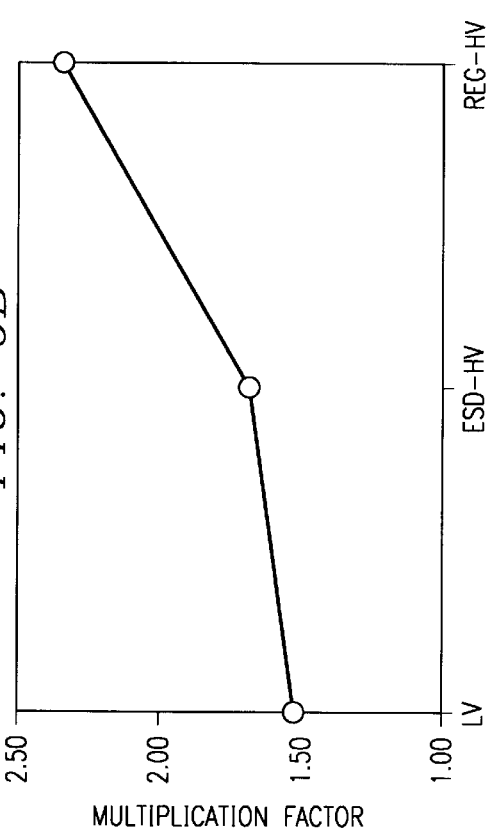

FIG. 5 shows a graph of peak substrate current vs Lpoly, demonstrating that the ESD HV transistor has higher substrate current than the regular HV transistor.

FIGS. 6A–D are charts comparing the values respectively of It2, Multiplication Factor (M), Current Gain, and Effective Substrate resistance (Rsub) for the three types of transistors, corresponding to the technology of FIG. 4A. As can be seen from the plots, the It2 of the regular HV transistor is lower than that of the ESD HV transistor. This is because the multiplication factor of the regular HV transistor is higher than that of the ESD HV transistor and correspondingly the current gain of the regular HV is lower than that of the ESD HV. The higher multiplication factor is due to the higher avalanche voltage which means that a higher voltage is required to produce the same amount of avalanche current at the drain-substrate junction. The reduced current gain also results in a smaller substrate current.

Having the core channel and S/D dopings in the ESD HV transistor allows shorter channel lengths.

According to a disclosed class of innovative embodiments, there is provided: An integrated circuit structure, comprising: first, second and third pluralities of transistors of a first conductivity type; said first plurality of transistors having a first gate oxide thickness, a first channel doping profile, and a first drain extender doping profile; said second plurality of transistors having a second gate oxide thickness which is different from said first gate oxide thickness, a second channel doping profile which is different from said first channel doping profile, and a second drain extender doping profile which is different from said first drain extender doping profile; said third plurality of transistors having said second gate oxide thickness, said first channel doping profile and said first drain extender doping profile.

According to another disclosed class of innovative embodiments, there is provided: A fabrication method, comprising the steps of: (a.) fabricating a first plurality of NMOS transistors with a first gate oxide thickness, a first channel doping profile, and a first drain extender doping profile; (b.) fabricating a second plurality of NMOS transistors with a second gate oxide thickness, a second channel doping profile, and a second drain extender doping profile; (c.) fabricating a third plurality of NMOS transistors with said second gate oxide thickness, said first channel doping profile and said first drain extender doping profile.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

Although the process has been disclosed with LOCOS isolation and diffused wells, the concept of this patent can also be applied to other isolation techniques, such as shallow trench isolation (STI), and to other well structures, such as high energy implanted wells.

This process can also be applied to those split gate technologies that are processed on non-epi substrates with or without buried layers, as the same concepts apply.

What is claimed is:

1. A fabrication method for an integrated circuit, comprising the steps of:
    (a.) fabricating a first plurality of NMOS transistors with a first gate oxide thickness, a first channel doping profile, and a first drain extender doping profile;
    (b.) fabricating a second plurality of NMOS transistors with a second gate oxide thickness, a second channel doping profile, and a second drain extender doping profile;
    (c.) fabricating a third plurality of NMOS transistors with said second gate oxide thickness, said first channel doping profile and said first drain extender doping profile.

2. The method of claim 1, further comprising the steps of:

(d.) connecting said first plurality of transistors to a first voltage;

(e.) connecting said second plurality and said third plurality of transistors to a second voltage which is higher than said first voltage.

3. The method of claim 1, wherein said first, said second, and said third pluralities of transistors have identical profiles for a first main source/drain implants, a second main source/drain implants and a third main source/drain implants respectively.

4. The method of claim 1, wherein said first, said second and said third pluralities of transistors are NMOS.

5. The method of claim 1, wherein said integrated circuit is a CMOS circuit.

* * * * *